United States Patent
Hébert

(10) Patent No.: US 8,900,983 B1
(45) Date of Patent: Dec. 2, 2014

(54) STRUCTURE AND METHOD FOR SELF PROTECTION OF POWER DEVICE WITH EXPANDED VOLTAGE RANGES

(71) Applicant: François Hébert, San Mateo, CA (US)

(72) Inventor: François Hébert, San Mateo, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 13/892,268

(22) Filed: May 11, 2013

Related U.S. Application Data

(60) Division of application No. 12/156,305, filed on May 31, 2008, now Pat. No. 8,441,109, which is a continuation-in-part of application No. 11/657,862, filed on Jan. 25, 2007, now Pat. No. 7,999,363.

(51) Int. Cl.
*H01L 23/62* (2006.01)
*H02H 9/02* (2006.01)

(52) U.S. Cl.
CPC .................................. *H02H 9/026* (2013.01)

USPC .................... 438/584; 438/123; 257/E29.104

(58) Field of Classification Search
None
See application file for complete search history.

(56) References Cited

U.S. PATENT DOCUMENTS 7,999,363 B2 * 8/2011 Hebert et al. ................. 257/666
8,441,109 B2 * 5/2013 Hebert .......................... 257/666

* cited by examiner

*Primary Examiner* — Seahvosh Nikmanesh
(74) *Attorney, Agent, or Firm* — Bo-In Lin

(57) ABSTRACT

A vertical semiconductor power device includes a top surface and a bottom surface of a semiconductor substrate constituting a vertical current path for conducting a current there through. The semiconductor power device further includes an over current protection layer composed of a material having a resistance with a positive temperature coefficient (PTC) and the over current protection layer constituting as a part of the vertical current path connected to a source electrode and providing a feedback voltage a gate electrode of the vertical semiconductor power device for limiting a current passing there through for protecting the semiconductor power device at any voltage.

5 Claims, 9 Drawing Sheets

STRUCTURE AND METHOD FOR SELF PROTECTION OF POWER DEVICE WITH EXPANDED VOLTAGE RANGES

This application is a Divisional Application of a co-pending Application and claim the Priority Date of application Ser. No. 12/156,305 file by a common Applicant of the Application on May 31, 2008. application Ser. No. 12/156,305 is now issued as U.S. Pat. No. 8,441,109 on May 14, 2013. application Ser. No. 12/156,305 is a Continuation in Part (CIP) Application and claims priority to pending U.S. patent application entitled "STRUCTURE AND METHOD FOR SELF PROTECTION OF POWER DEVICE" filed on Jan. 25, 2007 and accorded Ser. No. 11/657,862 and issued as U.S. Pat. No. 7,999,363 by a common Applicant of this Application, the benefit of its filing date being hereby claimed under Title 35 of the United States Code. The disclosures made in application Ser. Nos. 12/156,305 and 11/657,862 are hereby incorporated by reference in this Application.

FIELD OF THE INVENTION

The invention relates generally to a device configuration and method of protecting the device. More particularly, this invention relates to an improved circuit configuration and method of protecting active devices operated at a high voltage from damages due to over current caused by an electrical short by using a conductive material with a positive temperature coefficient.

DESCRIPTION OF THE RELEVANT ART

Under high power conditions, the power devices often fail in a "short circuit" condition and that can result in damages to other components in the system where the power devices are implemented. Therefore, it is preferable that a power device fails in an open circuit state and even more preferable that a failure can be avoided entirely. Prevention of failure can be achieved by integrating a protective circuit as part of the device or outside of the device. One particular protection implemented in a semiconductor device is to place a fusible link such as a metal fuse or a polysilicon fuse shown in FIG. 1A in the interconnect pattern before the bond pads. However, as shown in FIG. 1B such configuration has a limitation that for very high current application, multiple fuses and pads would be required thus causing an increase in die size and that leads to unfavorable cost impacts in manufacturing and in operation. Another disadvantage associates with multiple fuses and pads is that in case not all fuses blow open during an over-current condition, the active region of the device where the fuse did not blow open would be damaged. Furthermore, the addition of the protective circuit such as metal fuse, polyfuse, or other "fail-open" protective circuits, often adversely affects the device or system performance. The fuse protection also has a disadvantage that such protection is not re-settable, once the fuse is broken, the fuse connection is broken even the over current condition is then eliminated.

In order to overcome such limitations, materials of a positive temperature coefficient (PTC) are implemented as re-settable over current protection device. Various PTC materials are known such as a polymer PTC (PPTC), which is commercially available in the market as "PolyFuse", "Polyswitch" and "Multiswitch". The products may be provided as a slice of plastic with carbon grains embedded in it. When the plastic is cool, the carbon grains are all in contact with each other, forming a conductive path through the device. When the plastic heats up, it expands, forcing the carbon grains apart, and causing the resistance of the device to rise rapidly. Like the BaTiO3 thermistor, this device has a highly nonlinear resistance/temperature response and is used for switching, not for proportional temperature measurement. The PTC application is disclosed in U.S. Pat. No. 4,238,812 and various data sheets that provide the FTC materials as commercial products. Effectiveness of PTC protections has been demonstrated with an increase in resistance of up to five orders of magnitude when the temperature is increased.

Even though the application of materials of a positive temperature coefficient (PTC) for over-current protection of electronic devices is well known, there are still technical limitations and difficulties when the FTC materials are actually implemented. The FTC protection circuit is usually achieved by connecting the protection device as in FIG. 1C comprising PTC a material that has a resistance increases with temperature to a load. However, in order to achieve the protection, self-heating is usually required to increase the temperature and that requires an $I^2R$ drop within the device with a special mounting to avoid the heat sink that could reduce the effectiveness of device protection. In the meantime, higher resistance can induce more self-heating to achieve better protection. However, that negatively impacts the performance of the power systems. Alternatively, external heating may be used to heat the PTC materials by adding more circuit components but the added circuit components cause the current limiting protection to occupy large volume.

Another difficulty encountered in the protection of device applying the PTC materials is in the device operated at higher voltage. For the sake of reducing power consumption and increase operational efficiency, it is generally desirable to reduce the resistance of the protection circuits. However, as the resistance of the protection circuit is reduced, the voltage rating of the protection also tends to reduce. For some application with devices necessary to operate at a high voltage rating, the reduction of voltage rating of the protection circuit implemented with the materials with a positive temperature coefficient (PTC) becomes a major drawback and limitation. In addition, as the PTC protection circuit turns off, it takes on the applied (drain-source) voltage. Therefore, the voltage rating of the PTC device needs to equal or exceed the applied voltage. For higher voltage applications, this requires a PTC device to have correspondingly high voltage rating, which increases the resistance of the PTC device, even when during normal operation.

Specifically, a patent application Ser. No. 11/657,862 filed on Jan. 25, 2007 discloses a new device configuration, the disclosures of application Ser. No. 11/657,862 is hereby incorporated by reference in this Application. The application Ser. No. 11/657,862 discloses device configuration that has a PTC protection layer connected in series with the drain electrode of the active device. The device configuration however has a drawback that the voltage rating of the PTC structure has to equal or exceed the applied voltages thus limiting the scopes of applications of this type of protection circuits.

Therefore, a need still exists in the fields of circuit design and device manufactures for providing a new and improved configuration and manufacturing method to resolve the above-discussed difficulties. Specifically, a need still exists to provide new and improved configuration to implement the FTC protection such that the above discussed limitations and difficulties can be resolved.

SUMMARY OF THE PRESENT INVENTION

It is therefore an aspect of the present invention to provide a new and improved resettable PTC protection configuration that can work with any enhancement mode device and any voltage rating such that the above-discussed difficulties and limitations can be resolved.

It is an aspect of this invention that by applying the PTC (positive temperature coefficient) fuse protection layer to the source connection of the active device a PTC structure is inherently protected by the system or by the external circuit in this new configuration. The FTC fuse applies a feedback voltage to the FET gate control voltage that automatically turns the transistor off as an over-current and high temperature condition occurs.

It is an aspect of this invention that the PTC fuse protection layer is stacked with the FET, such that the fuse is applied to the source connection of the FET.

It is an aspect of this invention that by applying the PTC fuse to the source connection of the active device wherein a standard top source vertical enhancement mode FET is implemented with the drain disposed at the bottom of a semiconductor substrate. The FTC structure is formed on the top of the FET to connect to the source electrode. The FTC structure is inherently protected by the system or by the external circuit in this new configuration because the FTC fuse applies a feedback voltage to the FET gate control voltage to turn off the transistor automatically.

It is an aspect of this invention that by applying the FTC fuse to the source connection of the active device wherein a bottom source vertical enhancement mode FET is implemented with the source disposed at the bottom of a semiconductor substrate. The PTC structure is formed on the bottom of the FET to connect to the source electrode. Again, the PTC structure is inherently protected by the system or by the external circuit in this new configuration because the PTC fuse applies a feedback voltage to the FET gate control voltage to turn off the transistor automatically.

It is an aspect of this invention that by applying the PTC fuse to the source connection of the active device, a temperature rise within the electronic device is automatically imposed onto the PTC material and furthermore, the PTC protection is implemented with minimum increase of the parasitic resistance and expanded voltage ranges such that the above-discussed difficulties and limitations encountered by the conventional PTC protection can be overcome.

It is an aspect of this invention that by applying the PTC fuse to the source connection of the active device that has improved thermal coupling with the heat generation components or regions within an electronic device and meanwhile, such coupling is provided with minimum increase in coupling or parasitic resistance.

It is an aspect of this invention that by applying the PTC fuse to the source connection of the active device to provide a new and improved PTC protection configuration that the PTC protection configuration can be conveniently implemented with standard packaging techniques thus the unfavorable impact on manufacture costs can be avoided.

It is an aspect of this invention that by applying the PTC fuse to the source connection of the active device to provide a new and improved FTC protection configuration that the FTC protection configuration can be implemented without increase in package size thus decreasing potential unfavorable impact on manufacture costs.

It is an aspect of this invention that by applying the PTC fuse to the source connection of the active device to provide a new and improved FTC protection configuration that the protection fuse layer composed a FTC material such as ceramic-based FTC materials or polymeric-based FTC (PPTC) materials.

Briefly in a preferred embodiment this invention discloses a vertical semiconductor power device that includes a top surface and a bottom surface of a semiconductor substrate constituting a vertical current path for conducting a current there through. The semiconductor power device further includes an over, current protection layer composed of a material having a resistance with a positive temperature coefficient (PTC) and the over current protection layer constituting as a part of the vertical current path connected to a source electrode and providing a feedback voltage a gate electrode of the vertical semiconductor power device for limiting a current passing there through for protecting the semiconductor power device at any voltage. In an exemplary embodiment, the over current protection layer composed of a resettable current limiting material. In another exemplary embodiment, the over current protection layer is attached to the bottom surface. In another exemplary embodiment, the over current protection layer is attached to the top surface of the semiconductor power device with bonding wires connected to the source electrode. In another exemplary embodiment, the over current protection layer is disposed between the bottom surface of a semiconductor substrate constituting the source electrode of the semiconductor power device and a leadframe.

The present invention further discloses a method for manufacturing an electronic device with an integrated over current protection. The method includes a step of disposing an over current protection layer composed of a current limiting material for contacting a source electrode of the electronic device. The method further includes a step of disposing a layer composed of a material having a positive temperature coefficient (PTC) as the current limiting protection layer on a top surface of a semiconductor power device functioning as the source electrode of the semiconductor power device. The method further includes a step of disposing a layer composed of a material having a positive temperature coefficient (PTC) as the current limiting protection layer on a bottom surface of a semiconductor power device functioning as the source electrode of the semiconductor power device.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
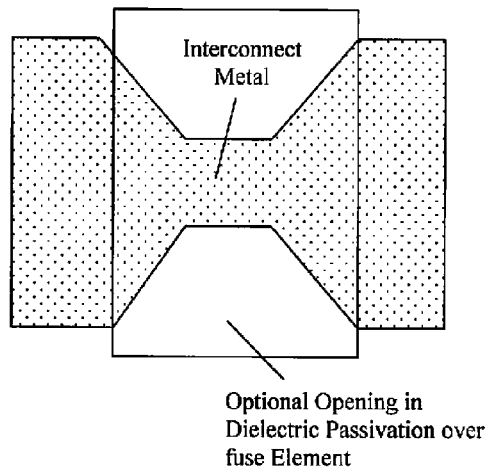
FIGS. 1A to 1C show different implementation configurations of over current protections for protecting devices from damages caused by circuit short.
Figure 1B:
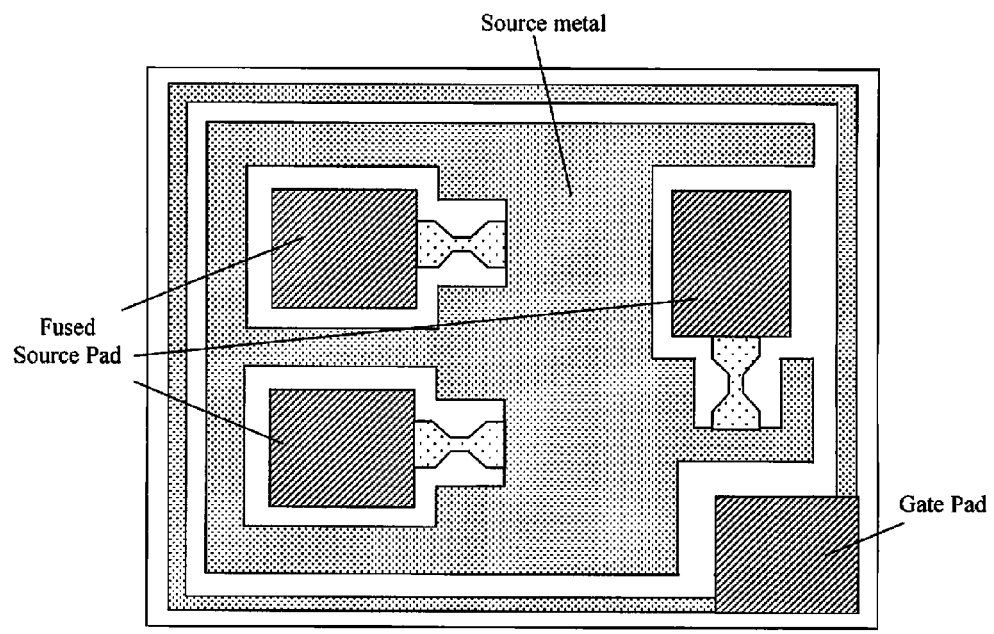
Figure 1C:
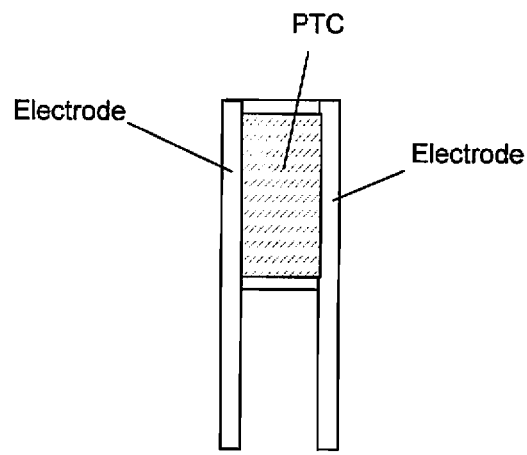
Figure 2:
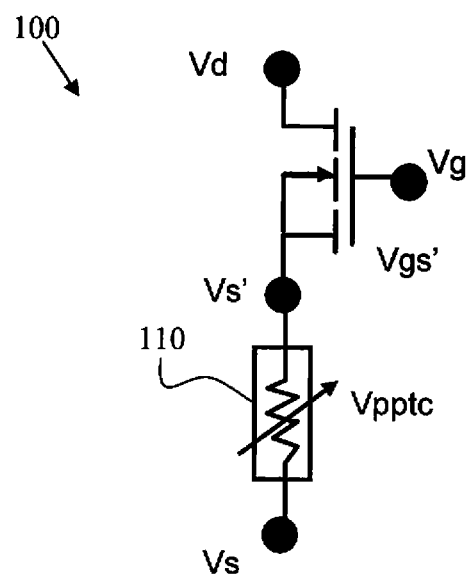
FIG. 2 is schematic representation of a PTC protection circuit connected to a source electrode.

FIG. 2 is a schematic representation of a PTC protected FET 100, (which can also be referred to as a fuse FET) that includes a resistor 110 composed of a material, that has a positive temperature coefficient (FTC) and configured as a conductive layer connected to a source electrode and further provides a feedback voltage to regulate the gate-source voltage. As the temperature of the device under protection is increased, the resistance of the PTC resistor 110 is also increased and the resistance is drastically increased once the PTC trip temperature is reached. In this protection configuration, any source to drain current (Ids) increase will result in a voltage drop Vptc across the PTC structure 110 thus reducing the FET control voltage Vgs. Specifically, the voltages have functional relationships that can be represented as:

$$Vgs=Vgs'+Vptc$$

$$Vgs'=Vgs-Vptc$$

When the temperature of the device is above the trip temperature of the PTC, the voltage drop across the FTC structure Vptc is much greater than the gate to drain voltage Vgs', i.e., Vptc>>Vgs', and causes the FET to turn down or shut off. The trip temperature is selected to protect the fuse FET from over current conditions. Therefore, the voltage changes of the FET under protection automatically protect the PTC structure from over-voltage by itself. Furthermore, this fuse FET configuration can also be applied to any drain voltages as well with the only requirement that the FTC structure should match the gate-source voltage rating of the FET under protection by the FTC structure, i.e., the voltage rating of the FTC structure should be as great or greater than the gate-source voltage rating of the FET. The voltage rating of the PTC structure is independent, of the drain (drain-source) voltage. Even in high voltage applications (high drain-source voltage), a PTC structure can have a low voltage rating, and thus provide low resistance for the fuse FET under normal operating conditions.

Figure 3A:
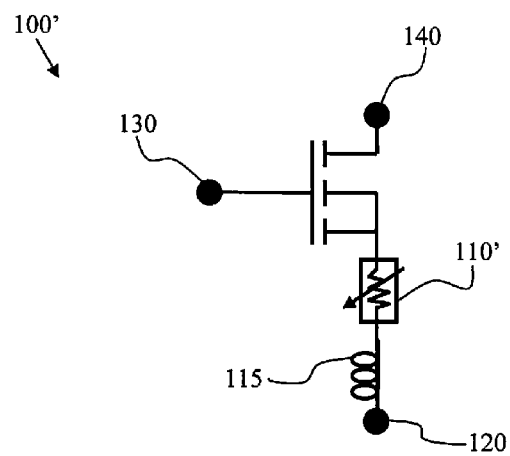
FIG. 3A is a circuit diagram.
Figure 3B:
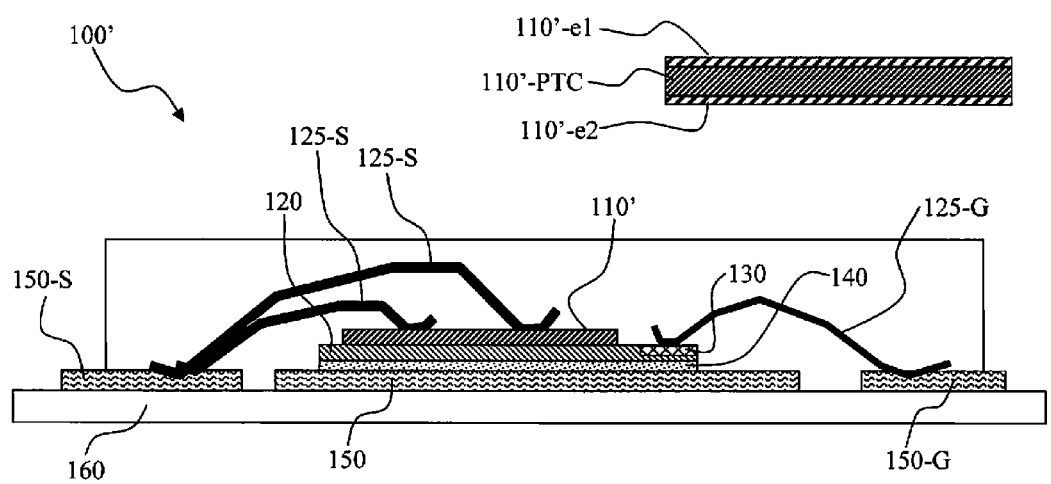
FIG. 3B is a side cross sectional view and FIG. 3C is a top view of a standard vertical DMOS power MOSFET device implemented with a FTC protection of this invention.
Figure 3C:
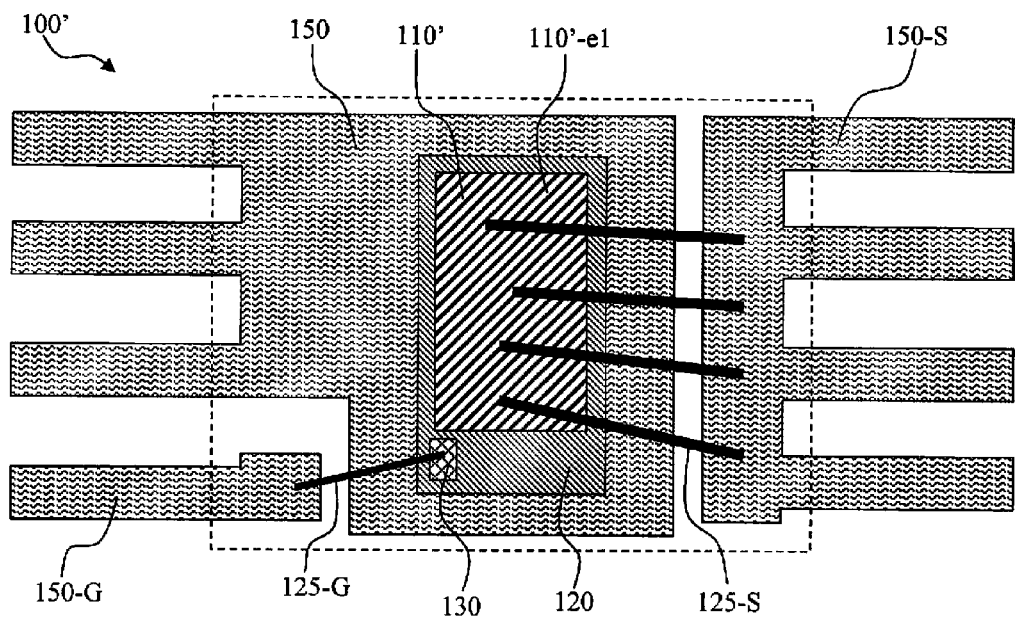

FIG. 3A is a schematic circuit diagram and FIGS. 3B to 3C illustrate the actual implementation of such PTC protection structure for a vertical DMOS with a top source and bottom drain configuration. A FET device 100' is mounted on a printed circuit board (PCB) 160 and connected through leads of a lead frame 150 with a gate connection 150-G and source connection 150-S disposed on top of the PCB. A vertical DMOS device with a bottom drain electrode 140 is disposed on top of the lead frame 150 and has a top source metal 120. A PTC protection structure that includes a PTC layer 110'-PTC and a top and bottom electrode layers 110'-e1 and 110'-e2 respectively are disposed on top of the source metal layer 120. The top and bottom electrodes of the PTC devices can be composed of any gold containing metal, alloy, or multi-layer structure such as Au, NiAu, etc., or copper (Cu). The PTC layer 110'-PTC may include a FTC protection fuse layer composed of ceramic-based PTC materials or polymeric-based PTC (PPTC) materials, or any other suitable PTC material. Bonding wires 125 connected the top electrode 110'-e1 to the leadframe 150-S. The bonding wires 125-G connected between the gate pad 130 and the leadframe 150-G. The PTC structure is attached on the active source regions of the FET. The PTC structure, DMOS, bonding wires and parts of the leadframe are encapsulated in a molding compound to form a semiconductor package.

Figure 4A:
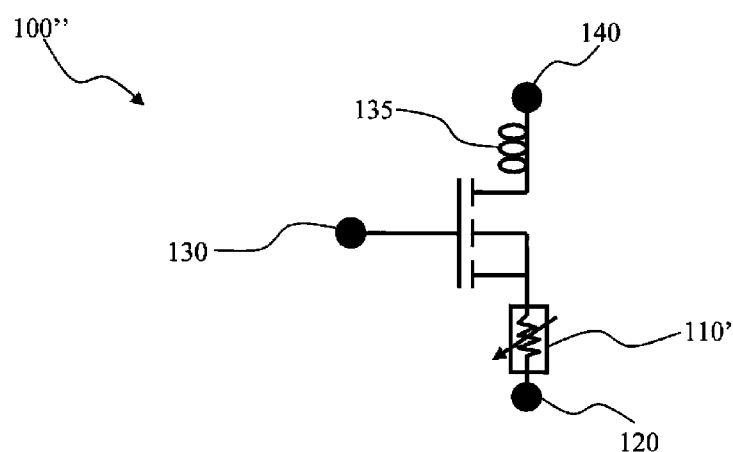
FIG. 4A is a circuit diagram.
Figure 4B:
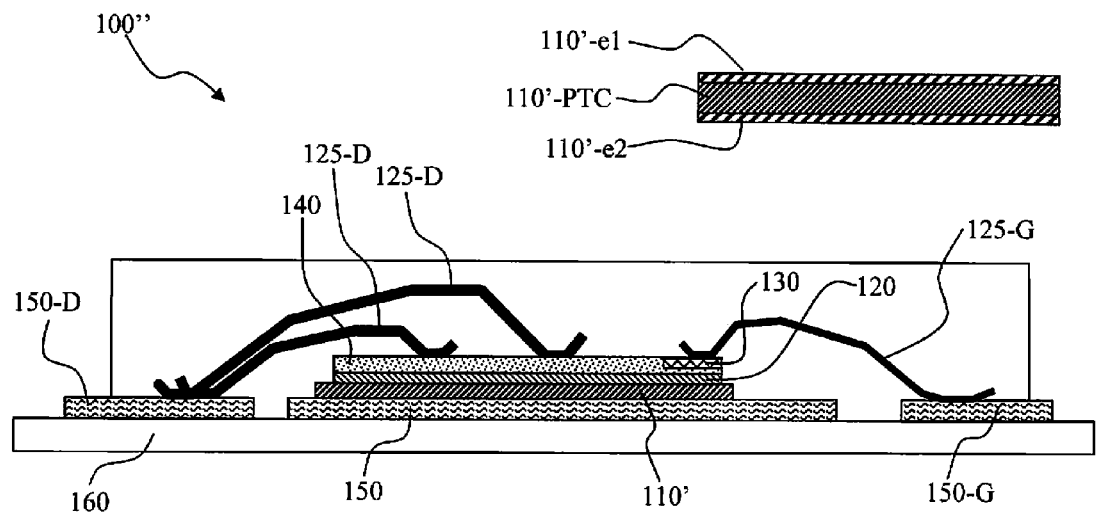
FIG. 4B is a side cross sectional view and FIG. 4C is a top view of a bottom source LDMOS power MOSFET device implemented with a PTC protection of this invention.
Figure 4C:
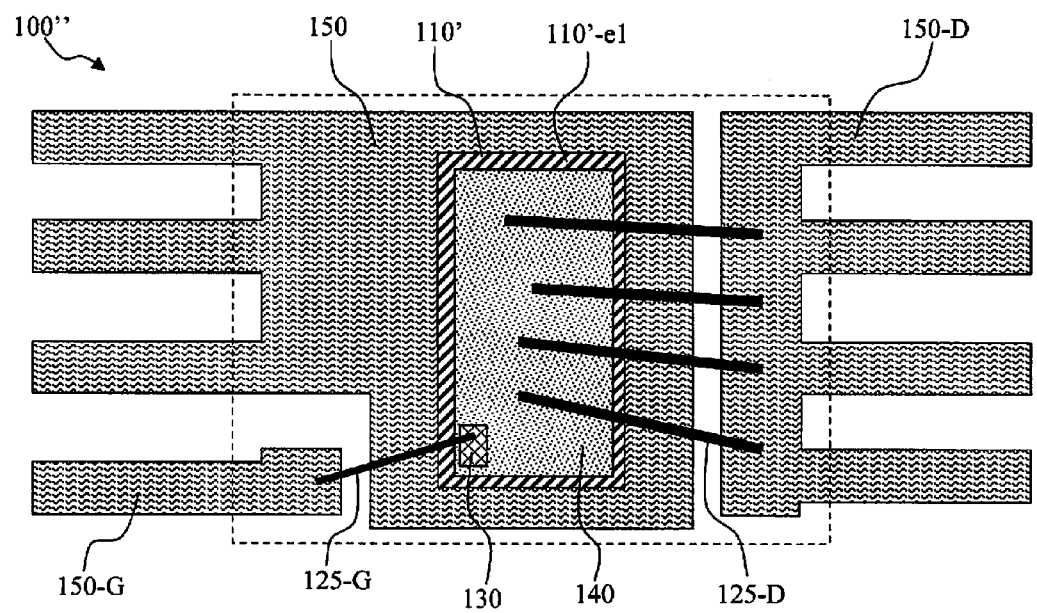

FIG. 4A is a schematic circuit diagram and FIGS. 4B to 4C illustrate the actual implementation of such PTC protection structure for a vertical DMOS with a bottom source and top drain configuration. A FET device 100" is mounted on a printed circuit board (PCB) 160 and connected through leads of a lead frame 150 with a gate connection 150-G and drain connection 150-D disposed on top of the PCB 160. A vertical DMOS device with a bottom source electrode 120' disposed on top of the PTC protection structure 110' disposed on top of the leadframe 150. The PTC structure comprises a PTC layer 110'-PTC padded by a top and bottom electrode layers 110'-e1 and 110'-e2 respectively. The top and bottom electrodes of the PTC devices can be composed of any gold containing metal, alloy, or multi-layer structure such as Au, NiAu, etc., or of copper (Cu). The bonding wires 125-D connect the top drain contact metal 140' formed on top of the VDMOS device with a bottom source 120' to the leadframe 150-D. The bonding wires 125-G connects the gate pad 130 to the leadframe 150-G. In this FET device, the PTC electrode 110'-e1 is in immediate contact with the bottom source electrode 120', and the PTC electrode 110'-e2 is in immediate contact with the leadframe 150.

The basic configuration of connecting the PTC structure to the source electrode as shown in FIGS. 3A to 4C can be implemented for device protection for any voltage range without being limited by the maximum voltage ratings of the PTC structures as the limitations encountered in the PTC to drain connection protection configurations. Furthermore, the protection configurations are also applicable to any enhancement mode FET devices, which include the low-voltage (LV) trench gate VDMOS FETs, the planar VDMOS FETs, the E-mode HEMTs (high electron mobility transistors), the E-Mode SiT (static induction transistor) and JFETs (junction gate FET). In addition to the wire-bonding package as shown, plate bonding can also, be implemented to improve performance.

Figure 5:
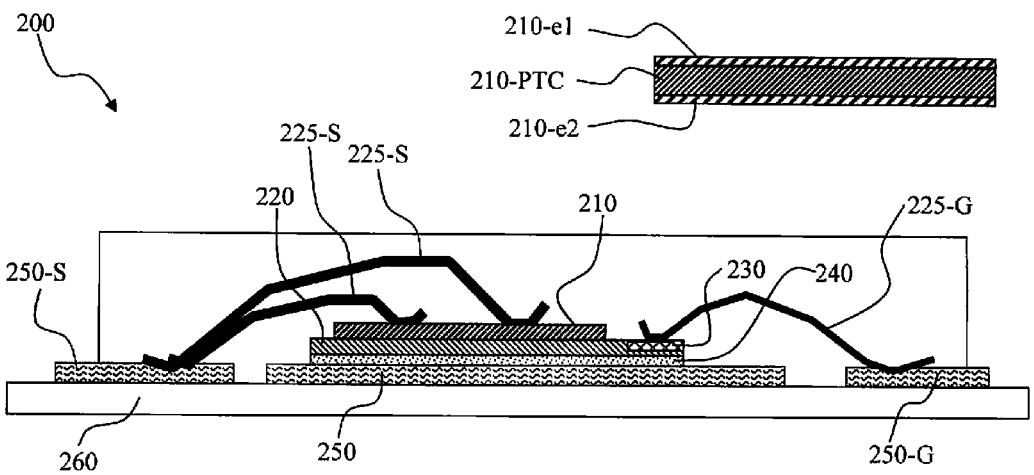
FIGS. 5 to 12 show the side cross sectional views of different embodiments of semiconductor power device protected by the PTC structure of this invention.

FIG. 5 is a cross sectional view for showing a standard vertical DMOS (VDMOS) power MOSFET die 200. A VDMOS device 200 is mounted on a printed circuit board (PCB) 260 and connected through the leads of a lead frame 250 with a gate connection 250-G and source connection 250-S disposed on top of the PCB. The vertical DMOS device 200 has a bottom drain electrode 240 disposed on top of the lead frame 250 and a top source metal 220 such as an aluminum source contact layer. An oxidation-resistant layer formed by an electroless NiAu plating may be formed on the aluminum surface prior to the attachment of the PTC protection structure 210. The drain electrode is formed by a standard back metal process on the MOSFET die using a standard back metal layer such as a TiNiAg or TiAu or CrAu layer to form the drain electrode as the bottom electrode 240. The PTC protection structure includes a PTC layer 210-PTC and a top and bottom electrode layer 210-e1 and 210-e2. The electrode-layers 210-e1 and 210-e2 can be formed with NiAu pressed onto the PTC layer 210-PTC from the top and bottom respectively. Thus, the top and bottom electrodes of the PTC devices can be composed of any gold containing metal, alloy, or multi-layer structure such as Au, NiAu, or of copper (Cu). Bonding wires 225 connect the top electrode 210-e1 to the leadframe connection 250-S. The bonding wires 225-G connected between the gate pad 230 and the leadframe connection 250-G. The PTC structure is attached on the active source regions of the FET. The packaging processes begin with the application of a conductive epoxy to attach the MOSFET device to the leadframe 250. Then, a conductive epoxy is applied on top of the source metal layer 220 for attaching the PTC structure 210 on the top surface of, the source metal layer 220. A wire bonding process is processed for bonding the source bonding wire 225-S connecting the PTC structure 210 to the leadframe 250-S and gate bonding wire 225-G connecting the gate pad 230 to the leadframe 250-G. The packaging processes are completed by a step of encapsulating the device in a molding compound 270 for encapsulating and protecting the VDMOS die.

Figure 6:
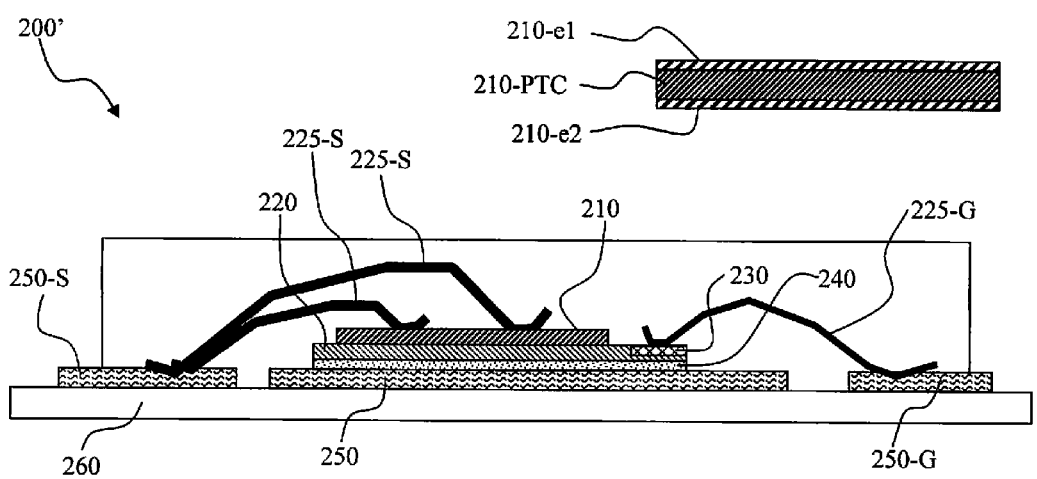
Figure 7:
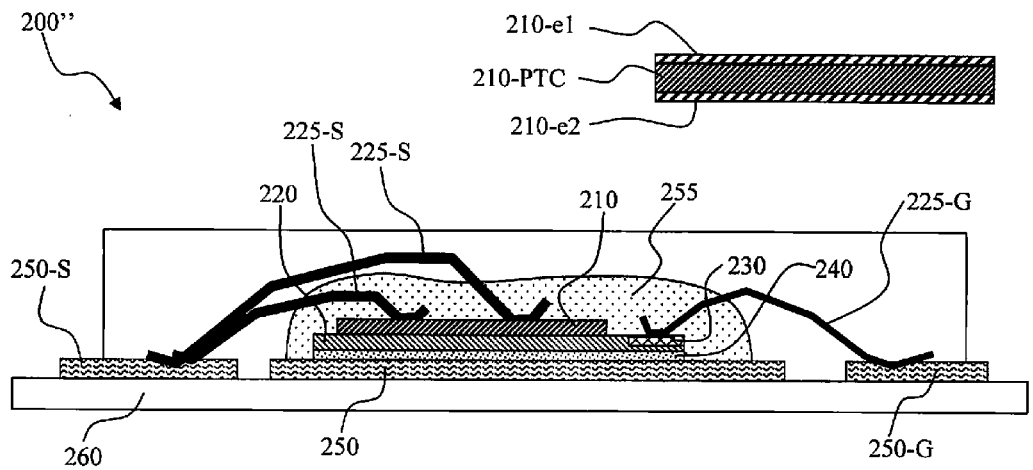

FIG. 6 is another standard VDMOS package 200' similar to the device shown in FIG. 5, except that the packaging processes begin with the application of a solder paste rather than a conductive epoxy to attach the MOSFET device to the leadframe 250. Then, a solder paste is applied on top of the source metal layer 220 for attaching the PTC structure 210 on the top surface of the source metal layer 220. A wire bonding process is processed for bonding the source bonding wire 225-S connecting the PTC structure 210 to the leadframe 250-S and gate bonding wire 225-G connecting the gate pad 230 to the leadframe 250-G. The packaging processes are completed by a step of encapsulating the device in an encapsulation 270 for protecting the VDMOS die. FIG. 7 is another standard VDMOS package 200" similar to the device shown in FIG. 6 except that a glob top 255 is formed covering the MOSFET device, PTC structure 210, and parts of the bonding wires 225 and leadframe 250 after the completion of the wire bonding process, but before the encapsulation step. The glob top 255 allows for thermal expansion of the PTC structure 210, formed on the top, surface of the die.

Figure 8:
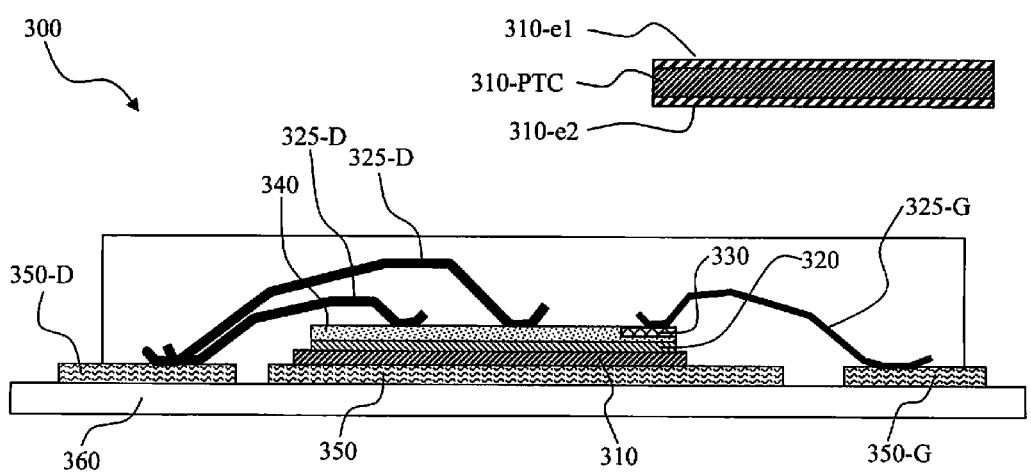

FIG. 8 is a cross sectional view for showing a bottom source LDMOS die 300. The bottom source LDMOS device 300 is supported on a printed circuit board (PCB) 360 and is disposed on top of a lead frame 350 and connected to the lead frame 350 with a gate connection 350-G and drain connection 350-D disposed on top of the PCB. A vertical LDMOS device with a bottom source electrode 320 disposed on top of the PTC protection structure 310 disposed on top of the leadframe 350. A PTC protection structure that includes a PTC layer 310-PTC and a top and bottom electrode layer 310-e1 and 310-e2 with NiAu pressed onto the PTC layer 320 from the top and bottom respectively. Thus, the top and bottom electrodes of the PTC devices can be composed of any gold containing metal, alloy, or multi-layer structure such as Au, NiAu, or of copper (Cu). The bonding wires 325-D connect the top drain contact metal 340 formed on top of the bottom source LDMOS device to the leadframe 350-D. The bonding wires 325-G connects the gate pad 330 to the leadframe 350-G. In this bottom source LDMOS device, the PTC structure 310 is in immediate contact with the bottom source electrode 320. The packaging processes begin with the application of a solder paste to attach the PTC 310 to the leadframe 350. Then, a solder paste is applied on top of the PTC structure 310 for attaching the source electrode 320 of the MOSFET device onto the PTC structure 310. A wire bonding process is processed for bonding the source bonding wire 325-D connecting the drain electrode 340 to the leadframe 350-D and gate bonding wire 325-G connecting the gate pad 330 to the leadframe 350-G. The packaging processes are completed by a step of encapsulating the device in an encapsulation 370 for protecting the bottom, source LDMOS die. The packaging processes for the device as shown in FIGS. 8 and 9 may further be modified by forming a glob top after the completion of the wire bonding process before the final step of encapsulation such that more thermal expansion flexibility of the FTC structure 310 is provided.

Figure 9:
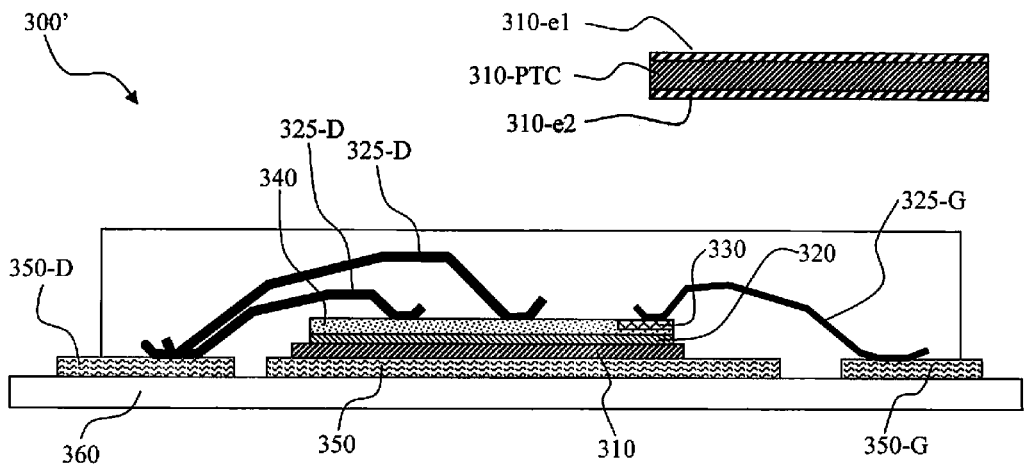

FIG. 9 is a cross sectional view for showing a bottom source LDMOS die 300'. The bottom source LDMOS device 300 is supported on a printed circuit board (PCB) 360 on top of a lead frame 350 and connected to a lead frame with a gate connection 350-G and drain connection 350-D disposed on top of the PCB. A vertical LDMOS device with a bottom source electrode 320 disposed on top of the PTC protection structure 310 disposed on top of the leadframe 350. A PTC protection structure that includes a PTC layer 310-FTC and a top and bottom electrode layer 310-e1 and 310-e2 with NiAu pressed onto the PTC layer 320 from the top and bottom respectively. Thus, the top and bottom electrodes of the PTC devices can be composed of any gold containing metal, alloy, or multi-layer structure such as Au, NiAu, or of copper (Cu). The bonding wires 325-D connect the top drain contact metal 340 formed on top of the bottom source LDMOS device, with a bottom source 320, to the leadframe 350-D. The bonding wires 325-G connects the gate pad 330 to the leadframe 350-G. In this bottom source LDMOS device, the PTC structure 310 is in immediate contact with the bottom source electrode 320. The packaging processes begin with the application of a conductive epoxy to attach the FTC 310 to the leadframe 350. Then, a conductive epoxy layer is applied on top of the FTC structure 310 for attaching the source electrode 320 of the MOSFET device onto the PTC structure 310. A wire bonding process is processed for bonding the source bonding wire 325-D connecting the drain electrode 340 to the leadframe 350-D and gate bonding wire 325-G connecting the gate pad 330 to the leadframe 350-G. The packaging processes are completed by, a step of encapsulating the device in an encapsulation 370 for protecting the bottom source LDMOS die. The packaging processes for the device as shown in FIGS. 8 and 9 may further be modified by forming a glob top after the completion of the wire bonding process before the final step of encapsulation such that more thermal expansion flexibility of the FTC structure 310 is provided.

Figure 10:
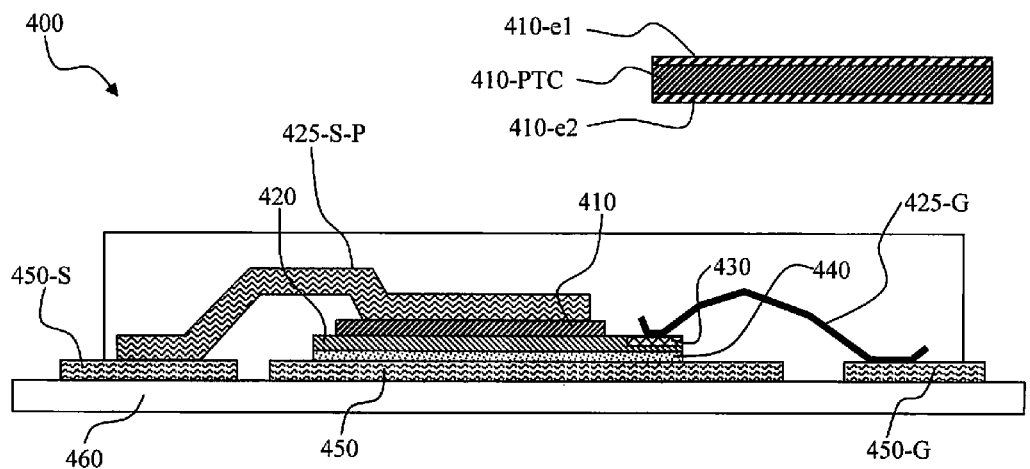
Figure 11:
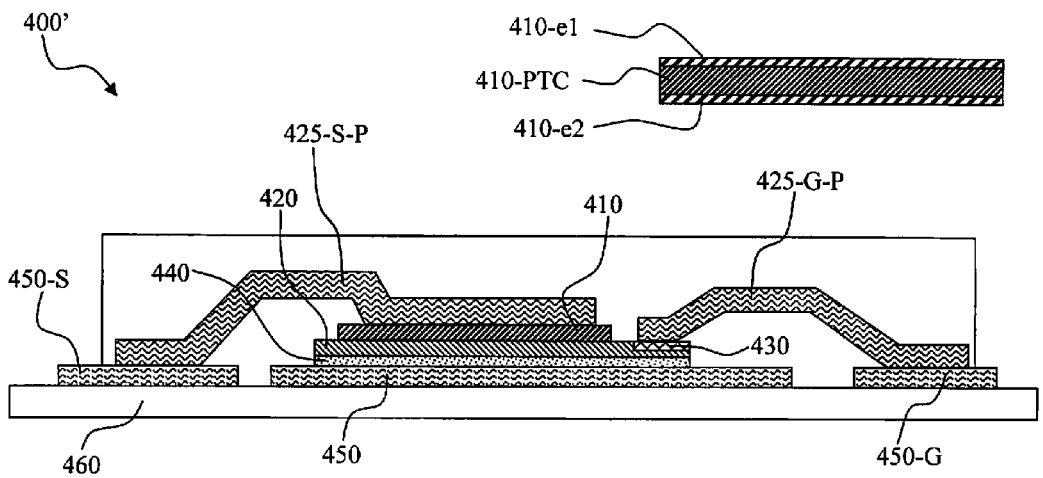

FIG. 10 is a cross sectional view for showing a standard vertical DMOS (VDMOS) power MOSFET die 400. A VDMOS device 400 is supported on a printed circuit board (PCB) 460 and connected to a lead frame with a gate connection 450-G and source connection 450-S disposed on top of the PCB. The vertical DMOS device 400 has a bottom drain electrode 440 disposed on top of the leadframe 450 and a top source metal 420 such as an aluminum source contact layer. An oxidation-resistant layer formed by an electroless NiAu plating may be formed on the exposed aluminum surface. The drain electrode is formed by standard back metal process on the MOSFET die using TiNiAg or TiAu or CrAu layer to form the drain electrode as the bottom electrode 440. A PTC protection structure that includes a PTC layer 410-PTC and a top and bottom electrode layer 410-e1 and 410-e2 made from NiAu pressed onto the PTC layer 410-PTC from the top and bottom respectively. A top plate 425-S-P connects the top electrode 410-e1 to the leadframe connection 450-S. The bonding wires 425-G connect between the gate pad 430 and the leadframe connection 450-G. The PTC structure is attached on the active source regions of the FET. The packaging processes begin with the application of a solder paste to attach the MOSFET device to the leadframe 450. Then, a solder paste is applied on top of the source metal layer 420 for attaching the PTC, structure 410 on the top surface of the source metal layer 420. Alternatively, instead of solder paste, a similarly functioning material can be used, e.g., conductive epoxy. A top plate bonding process is processed for bonding the source top plat 425-S-P connecting the PTC structure 410 to the leadframe 450-S and gate bonding wire 425-G connecting the gate pad 430 to the leadframe 450-G. The packaging processes are completed by a step of applying an elevate temperature for reflow and encapsulating the device in an encapsulation 470 for protecting the VDMOS die then cutting the leadframe and tabs or saw the wafer into VDMOS MOSFET dies. FIG. 11 shows another standard VDMOS MOSFET power device 400' similar to the semiconductor power device 400 as shown in FIG. 10. The only difference is that the gate bonding wires 425-G shown in FIG. 10 is now replaced with a gate top plate 425-G-P connecting between the gate pad 430 to the leadframe gate connection 450-G.

Figure 12:
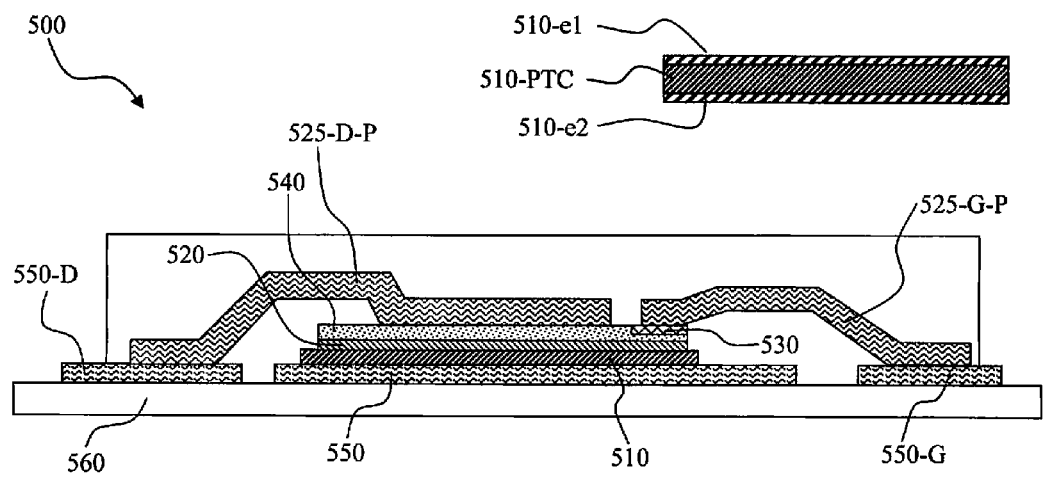

FIG. 12 is a cross sectional view for showing a bottom source LDMOS die 500. The bottom source LDMOS device 500 is supported on a printed circuit board (PCB) 560 under a leadframe 550. The leadframe 550 has a gate connection 550-G and a drain connection 550-D and is disposed on top of the PCB 160. A vertical LDMOS device with a bottom source electrode 520 is disposed on top of the PTC protection structure 510, which is disposed on top of the leadframe 550. A PTC protection structure includes a PTC layer 510-PTC and a top and bottom electrode layer 510-e1 and 510-e2 which can be made from NiAu pressed onto the PTC layer 510-PTC from the top and bottom respectively. Thus, the top and bottom electrodes of the PTC devices can be composed of any gold containing metal, alloy, or multi-layer structure such as Au, NiAu, or of copper (Cu). The top bonding plate 525-D-P connect the top drain contact metal 540 formed on top of the bottom source LDMOS device, with a bottom source 520, to the leadframe 550-D. The gate bonding plate 325-G connects the gate pad 530 to the leadframe 550-G. In this bottom source LDMOS device, the PTC structure 510 is in immediate contact with the bottom source electrode 520. The packaging processes begin with the application of a solder paste to attach the PTC 510 to the leadframe 550. Then, a solder paste is applied on top of the PTC structure 510 for attaching the source electrode 520 of the MOSFET device onto the PTC structure 510. Alternatively a similarly suitable material such as conductive epoxy can be used instead of solder. A plate bonding process is processed for bonding the drain top plate 525-D-P connecting the drain electrode 540 to the leadframe 550-D and gate bonding plate 525-G-P connecting the gate pad 530 to the leadframe 550-G. The packaging processes are completed by a step of applying an elevate temperature to allow solder reflow and encapsulating the device in an encapsulation 570 for protecting the bottom source LDMOS die.

The FTC layers shown in the above FIGS. 4A to 12, such as the PTC layers 110'-FTC, 210-PTC, 310-FTC, 410-FTC and 510-FTC, may include a PTC protection fuse layer composed of either ceramic-based PTC materials or polymeric-based FTC (PPTC) materials or any other suitable PTC material. These PTC materials may include doped ceramic of barium titanate as that disclosed in U.S. Pat. No. 4,238,812 even though there is a concern that the materials may have limited application due to the fact that the layer may become brittle at a higher temperature. The FTC materials may further include conductive polymers that have particulate conductive filler dispersed in the bulk of the polymer layer as that disclosed in. U.S. Pat. No. 4,238,812 and have been successfully implemented commercially by Raychem and other companies to fabricate FTC fuse layer with a thickness of about 0.5 Angstroms available as a Trademarked product under the Trademark of PolyFuse™.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A method for protecting a vertical semiconductor power device having a top surface and a bottom surface of a semiconductor substrate constituting a vertical current path for conducting a current therethrough comprising:

disposing an over current protection layer composed of a material having a positive temperature coefficient (PTC) of resistance constituting as a part of said vertical current path and connected to a source electrode and providing a feedback voltage to a gate electrode of the vertical semiconductor power device for limiting a current passing there through for over-current protection not limited by a voltage rating of said over current protection layer.

2. The method of claim 1 wherein:

said step of disposing said over-current protection layer further comprising a step of disposing said over-current protection layer composed of a resettable current limiting material.

3. The method of claim 2 wherein:

step of disposing said over-current protection layer further comprising a step of attaching said over-current protection layer on a bottom surface of a bottom-source semiconductor power device for directly contacting a bottom source of the semiconductor power device.

4. The method of claim 2 wherein:

said step of disposing said over-current protection layer further comprising a step of attaching said over-current protection layer on a top surface of a bottom-drain semiconductor power device for directly contacting a top source electrode of the semiconductor power device.

5. The method of claim 2 wherein:

said step of disposing said over-current protection layer further comprising a step of disposing said over current protection layer with a voltage rating matched with a gate-source voltage rating of the semiconductor power device.

* * * * *